United States Patent
Cox et al.

(10) Patent No.: US 6,420,716 B1
(45) Date of Patent: Jul. 16, 2002

(54) SERVO CONTROL METHOD AND ITS APPLICATION IN A LITHOGRAPHIC APPARATUS

(75) Inventors: Harry H. H. M. Cox; Reinder T. Plug, both of Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 09/460,800

(22) Filed: Dec. 15, 1999

(30) Foreign Application Priority Data

Dec. 17, 1998 (EP) ............................................. 98204308

(51) Int. Cl.⁷ .............................. A61N 5/00; G21G 5/00
(52) U.S. Cl. ................................................... 250/492.2
(58) Field of Search ................................. 356/401, 399, 356/24, 23; 250/548, 201.2, 492.2; 430/296; 310/12, 51

(56) References Cited

U.S. PATENT DOCUMENTS 5,910,847 A * 6/1999 Van Der Welf et al. .... 356/401
6,191,429 B1 * 2/2001 Suwa .......................... 250/548

* cited by examiner

*Primary Examiner*—Jack Berman
*Assistant Examiner*—Johnnie L Smith, II
(74) *Attorney, Agent, or Firm*—Pillsbury Winthrop LLP

(57) ABSTRACT

In a photolithography apparatus, accelerations of the lens unit due to vibrational disturbances are measured and used to derive a control signal which is applied to the positioning means of the wafer table and/or mask table, so as to effect compensating motions of that table. This feedforward system can be optimized to correct for motions of the lens unit in specific frequency bands, e.g. in the vicinity of the eigenfrequency of the lens.

14 Claims, 3 Drawing Sheets

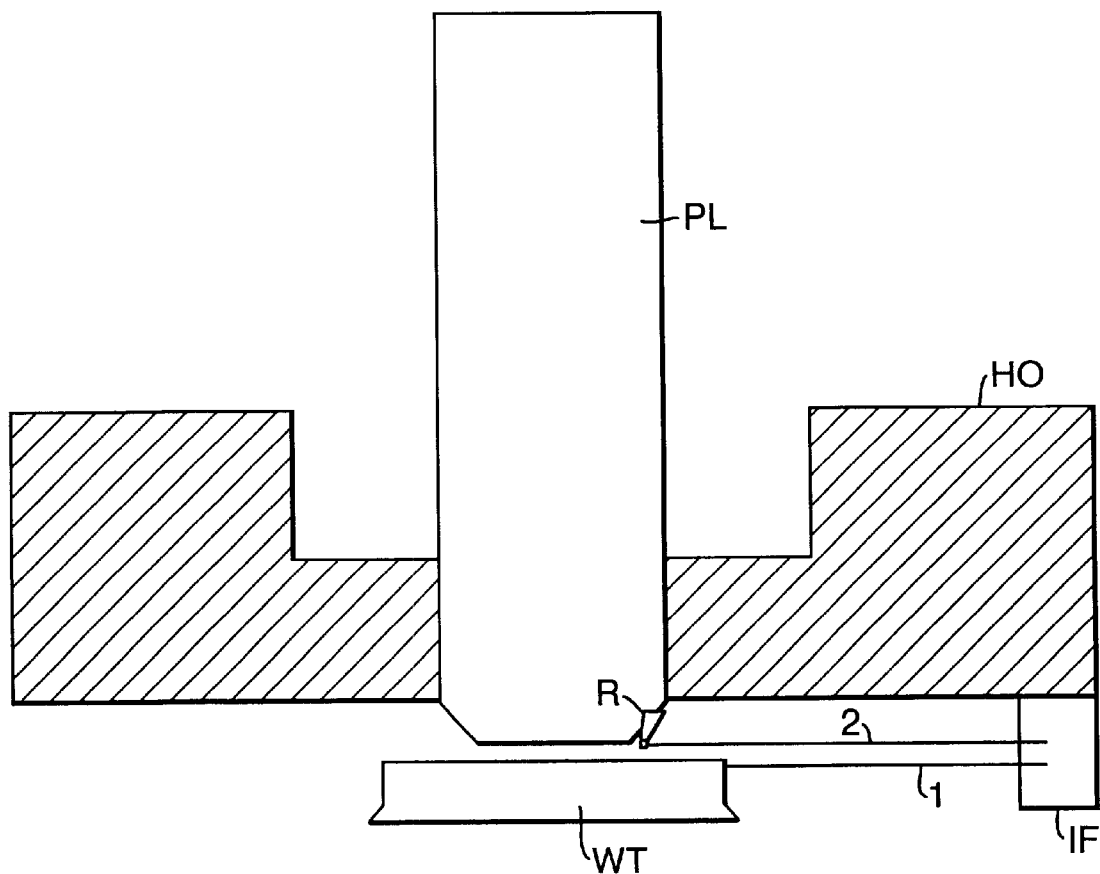

SERVO CONTROL METHOD AND ITS APPLICATION IN A LITHOGRAPHIC APPARATUS

BACKGROUND OF THE INVENTION

The present invention relates to servo control methods and apparatus. More particularly, the invention relates to the application of such methods and apparatus in a lithographic projection apparatus.

For the sake of simplicity, the projection system may hereinafter be referred to as the "lens"; however, this term should be broadly interpreted as encompassing various types of projection system, including refractive optics, reflective optics, catadioptric systems, and charged particle optics, for example. In addition, the first and second object tables may be referred to as the "mask table" and the "substrate table", respectively.

Lithographic projection apparatus can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies that are successively irradiated through the reticle, one at a time. In one type of lithographic projection apparatus, each die is irradiated by exposing the entire reticle pattern onto the die in one go; such an apparatus is commonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed at which the wafer table is scanned will be a factor M times that at which the reticle table is scanned. More information with regard to lithographic devices as here described can be gleaned from International Patent Applications WO 97/33205 and WO 96/38764, for example.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself, in this manner, it is possible to achieve a substantially increased machine throughput, which in turn improves the cost of ownership of the machine.

The projection radiation in current lithographic devices is generally UV (ultra-violet) light with a wavelength of 365 nm, 248 nm or 193 nm. However, the continual shrinkage of design rules in the semiconductor industry is leading to an increasing demand for new radiation types. Current candidates for the near future include UV light with wavelengths of 157 nm or 126 nm, as well as extreme UV light (EUV) and particle beams (e.g. electron or ion beams).

In an apparatus as described above, it is necessary to control the relative position of the object tables and the lens to a very high degree of accuracy. Transient inaccuracies in this relative position, which may be caused by vibrations, are therefore particularly problematic. Whilst it may be relatively easy to detect the existence of such vibrations, it requires considerable work to identify and eliminate their sources. Lens vibrations may, for example, be caused by floor vibrations, indirect scanning forces (in the case of step-and-scan devices), noise in vibration isolation systems (originating in pneumatic suspension devices in the apparatus) or acoustic noise, among other things. Since the lens is generally quite large and heavy (e.g. with a mass of the order of about 50–250 kg), it is particularly sensitive to vibrations with a relatively low frequency.

A lithographic projection process may require the positional error of the substrate holder and/or mask holder relative to the lens to be of the order of 2 nm or less. In addition, practical considerations in servo system design can demand that the positional stability of the lens be within tolerances of the order of 1 nm. In tests, the inventors have observed that positional errors of this magnitude can, under certain conditions, be produced by disturbance forces of the order of as little as 1N (acting on a machine that may have a mass of several hundred to several thousand kg). The desired degree of stability can therefore be very difficult to achieve.

SUMMARY OF THE INVENTION

It is an object of the present invention to alleviate this problem. More specifically, it is an object of the invention to provide a lithographic projection apparatus in which effective measures are taken to reduce the detrimental effect of lens vibrations on the accuracy with which the substrate and/or reticle tables can be positioned relative to the lens.

According to the present invention, these and other objects are achieved in a lithographic projection which includes a detection mechanism for detecting accelerations of the projection system, and generating at least one acceleration signal representative thereof, and a control mechanism responsive to the acceleration signal, for generating at least one control signal to control at least one of the positioning mechanisms so as to move the corresponding object table, thereby to compensate for movements of the projection system.

The present invention also provides a method of controlling the relative position of at least one of the object tables and the projection system in such a lithographic projection apparatus, the method comprising the steps of:

measuring accelerations of the projection system;

determining a force to be applied to at least one of the object tables to cause movement thereof so as to compensate for movements of the projection system;

applying the determined force to that object table.

The feedfoward control provided by the present invention can substantially reduce the effect of vibrations (e.g. in the main frame or base plate of the lithography device) on the relative positions of the lens and object table (wafer table and/or reticle table). This feedforward control can be specifically tuned to provide maximum compensation within particular frequency bands, e.g. around the eigenfrequency of the lens.

The invention is applicable to one or more of the 6 degrees of freedom of the lens, substrate table and/or mask table. For the sake of simplicity, the following discussion will concentrate on a situation whereby correction occurs in only one degree of freedom; however, the presented considerations are equally valid for more degrees of freedom. In this latter case, it will be usual to have a set of detection mechanisms (e.g. one per controlled table per degree of freedom) and to generate several control signals (e.g. one per detection mechanism in the set).

In a preferential embodiment of the invention, the detection mechanisms mounted on the projection system in relatively close proximity (and preferably as close as possible) to the object table/tables whose position is/are to be controlled in response to the control signal. In such a case, a lens acceleration measured by the detection mechanism can be translated with relatively high accuracy into a force to be applied to the object tables(s). On the other hand, the accuracy of the extrapolated required movement of the table(s) is reduced when the detection mechanism is relatively distant from the (controlled) object table(s). In a situation whereby the invention is employed to control the positions of both the reticle table and the wafer table, two (for example) detection mechanisms can be employed—one in proximity to each table.

In the embodiment discussed in the previous paragraph, the detection mechanism comprises a device (such as an accelerometer) which can be affixed to the projection system; such a scenario is discussed below in Embodiment 2, for example. However, in an alternative situation, the detection mechanism comprises an interferometer device which interferometrically measure the relative position and motion of the projection system and at least one of the object tables; such a case is further elucidated below in Embodiment 4, for example.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

DESCRIPTION OF THE DRAWINGS

The present invention and its attendant advantages will be described below with reference to exemplary embodiments and the accompanying schematic drawings, in which:

FIG. 4 shows part of a lithographic projection apparatus in relation to a particular embodiment of the invention.

In the Figures, like reference symbols refer to like parts.

DETAILED DESCRIPTION OF THE INVENTION

Embodiment 1

Figure 1:
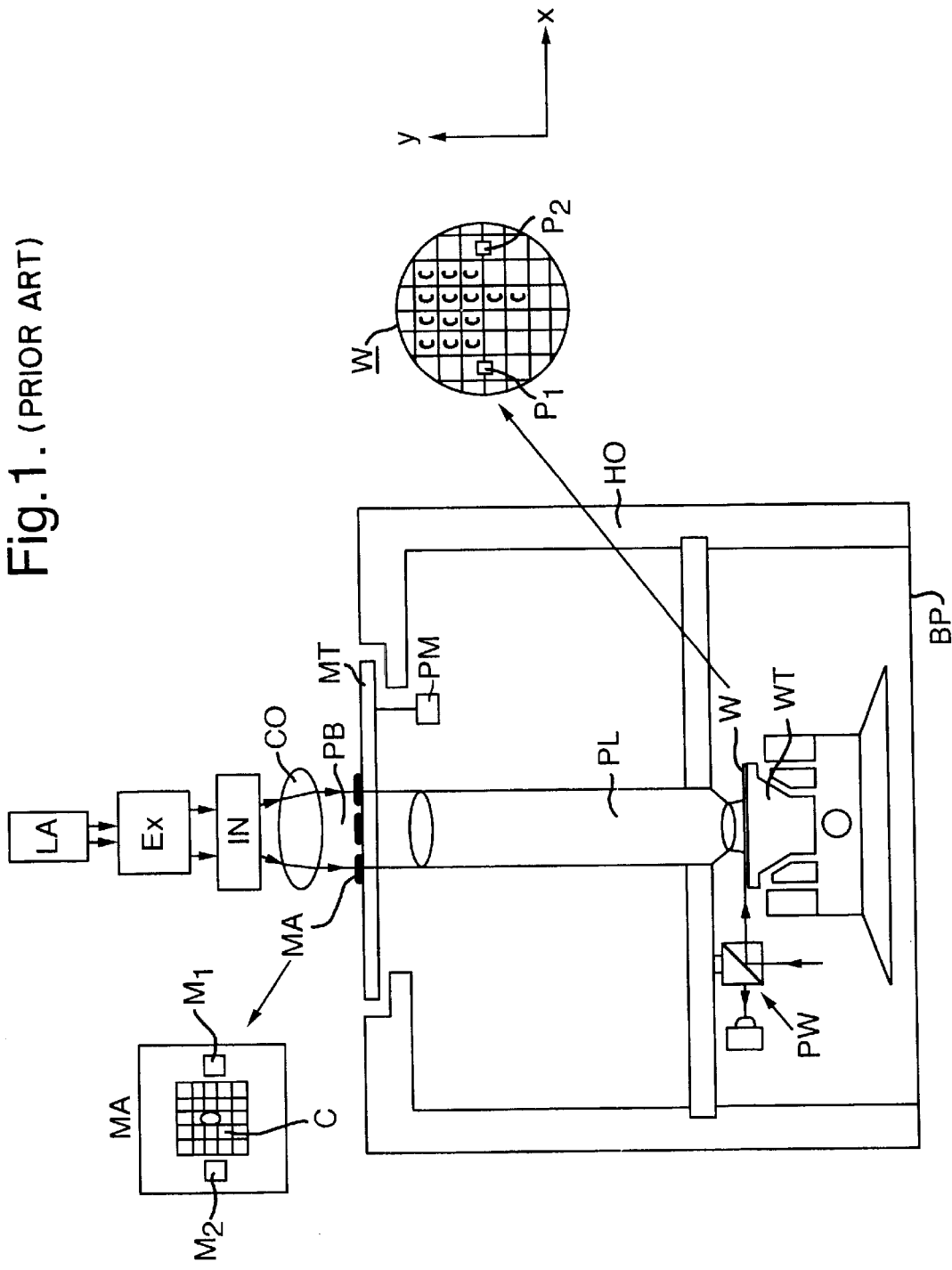
FIG. 1 schematically depicts a lithographic projection apparatus according to the invention.

FIG. 1 schematically depicts a lithographic projection apparatus according to the invention. The apparatus comprises:

- a radiation system LA, Ex, IN, CO for supplying a projection beam PB of radiation (e.g. UV or EUV radiation, electrons or ions);
- a first object table (mask table) MT provided with a mask holder for holding a mask MA (e.g. a reticle), and connected to a first positioning mechanism PM for accurately positioning the mask with respect to item PL;
- a second object table (substrate table) WT provided with a substrate holder for holding a substrate W (e.g. a resist-coated silicon wafer), and connected to a second positioning mechanism PW for accurately positioning the substrate with respect to item PL;
- a projection system ("lens") PL (e.g. a refractive or catadioptric system, a mirror group or an array of field deflectors) for imaging an irradiated portion of the mask MA onto a target portion C (die) of the substrate W.

As here depicted, the apparatus is transmissive (i.e. the mask MA is transmissive, and the projection lens PL is comprised of refractive components). However, the apparatus may also be (at least partially) based on reflective elements, such as a reflective mask, mirror optics, etc.

The radiation system comprises a source LA (e.g. a Hg lamp or excimer laser, an undulator provided around a particle beam from an accelerator, or a source of particulate radiation) which produces a beam of radiation. This beam is passed along various optical components,—e.g. beam shaping optics Ex, an integrator IN and a condensor CO—so that the resultant beam PB has a desired form and intensity throughout its cross-section.

The beam PB subsequently intercepts the mask MA which is held in a mask holder on a mask table MT. Having traversed the mask MA, the beam PB passes through the lens PL, which focuses the beam PB onto a target area C of the substrate W. With the aid of the interferometric displacement and measuring device PW, the substrate table WT can be moved accurately, e.g. so as to position different target areas C in the path of the beam PB. Similarly, the positioning mechanism PM can be used to accurately position the mask MA with respect to the path of the beam PB, e.g. after mechanical retrieval of the mask MA from a mask library. In general, movement of the object tables MT, WT will be realized with the aid of a long stroke module (course positioning) and a short stroke module (fine positioning), which are not explicitly depicted in FIG. 1.

The depicted apparatus can be used in two different modes:

In step mode, the mask table MT is kept essentially stationary, and an entire mask image is projected in one go (i.e. a single "flash") onto a target area C. The substrate table WT is then shifted in the x and/or y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

In general, each target portion C of the substrate W will be subjected to various exposures, in successive irradiation sessions. These exposures will typically result in patterned layers (e.g. the circuit patterns in the various semiconductor layers of an IC) which will have to be accurately overlapped with one another (with a so-called overlay precision that is often of the order of nanometers). In this context, it will be appreciated that highly accurate (re-)positioning of the substrate table WT with respect to the lens PL is of exceptional importance; similarly, the mask table MT must be very accurately positionable with respect to the lens PL. Vibrations in the various parts of the depicted apparatus (e.g. in the frame HO or base plate BP) can be transferred inter alia to the lens PL, where they can have a highly detrimental effect on the achievement of the required accuracy. The present invention can be used to alleviate this problem, e.g. as described in Embodiment 2.

Embodiment 2

Figure 2:
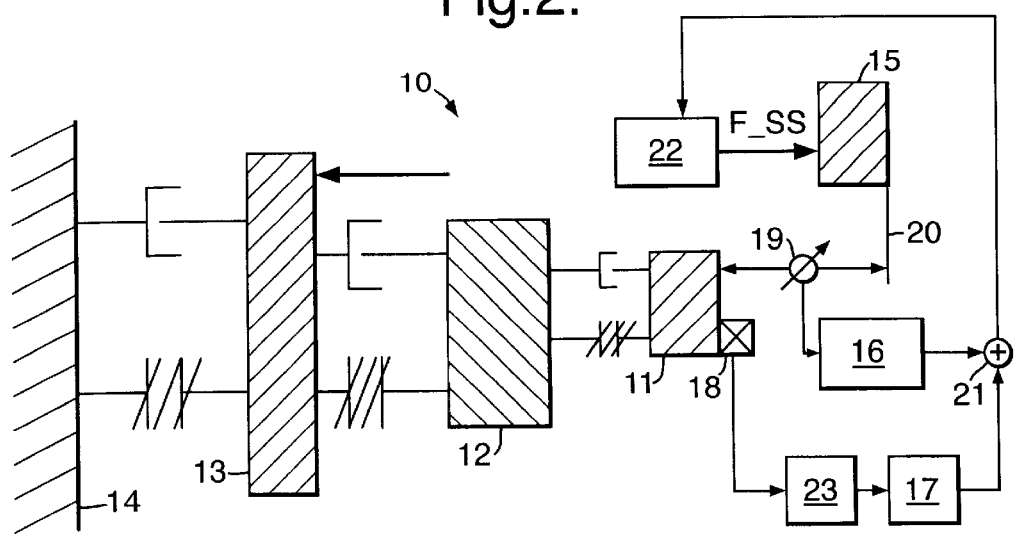
FIG. 2 is a schematic diagram of relevant components of a lithographic projection apparatus to which the present invention has been applied.

FIG. 2 is a schematic diagram of the relevant components of a lithographic projection apparatus 10 to which the present invention is applied. The components are represented as masses, and the interconnections between them as springs and dampers.

In FIG. 2, the lens 11 is mounted on a main plate 12, which in turn is mounted on a base frame 13. The base frame 13 is mounted on a floor 14, which is considered rigid for analysis purposes. The main plate 12 serves as the metrology frame for the apparatus. An accelerometer 18 is mounted to measure accelerations of the lens 11, and generates a signal A representative of the instantaneous acceleration of the lens. There are many suitable, commercially available accelerometers 18 for this purpose, and a choice can be made from a wide variety of operating principles, including, for example:

capacitive accelerometers (e.g. as supplied by the firms Analog Devices and Motorola);

piezoresistive accelerometers (e.g. as supplied by the firms Druck and J&M);

piezoelectric accelerometers (e.g. as supplied by the firm Bruel & Kjaer);

gyroscopic accelerometers (e.g. as supplied by the firm Murata);

thermal accelerometers (e.g. as supplied by the firm IG&G).

In a typical lithographic projection apparatus, the lens 11 will often have a mass of the order of about 50–250 kg, and an eigenfrequency in the approximate range 50–150 Hz. The mass of each of the main plate 12 and base frame 13 will generally be of the order of several hundred to a few thousand kg, and the eigenfrequencies of these parts will typically lie in the range 1–20 Hz.

In the current context, another important component of the lithographic apparatus is the short stroke module 15, which is used to control the fine position of an object table 20 (e.g. the substrate or reticle table) during the exposure procedure. The basic control of the short stroke module 15 is derived from position sensor 19 (e.g. a multi-axis interferometer system) which measures the relative position of the lens 11 and the table 20. A Proportional Integrating/Differentiating (PID) low-pass controller 16 derives a position control signal Sp.

Based on the known mass Mss of the module 15, and associated components, controller 17 generates an acceleration control signal, Sa, from the output signal, A, of the accelerometer 18. The acceleration control signal, Sa, is a feedforward signal.

The acceleration control signal Sa and position control signal Sp are added by adder 21 and supplied to the short stroke motor 22 which applies a force Fss to the module 15.

Tests have revealed that particularly problematic vibrations can be concentrated in a relatively narrow frequency band, e.g. in the region 90–100 Hz. The control unit 17 and other components of the present invention can be selected to effect optimal control of the position of the lens 11 relative to the object table 20 at a single frequency $f_o$, with somewhat less-optimal but still highly satisfactory control over a narrow frequency range around $f_o$.

At present, the inventors have determined that a reduction of the effect of lens motions by a factor of 5 to 10 or more can be achieved using an accelerometer of the following specification:

Sensor Bandwidth: 500–1000 Hz

Phase shift<−5 degrees at 100 Hz

AC-filter<5 Hz, <3 dB peak, phase shift<15 degrees at 10 Hz

Gain error≦1%

Noise<0.1×10$^{-3}$ ms$^{-2}$ RMS for 5–500 Hz and

Data I/O delay in motion controller of <50 μs, sample rate≧2 kHz.

Embodiment 3

A high-pass filter 23 with a cutoff frequency in the range 2–20 Hz may be included in the lens acceleration feedforward path. Such a filter is shown in FIG. 2 between the accelerometer 18 and control unit 17, but may be incorporated in either of those units or positioned elsewhere in the feedforward path. The high pass filter can improve high-frequency response, at the expense of some lower-frequency response.

Figure 3A:
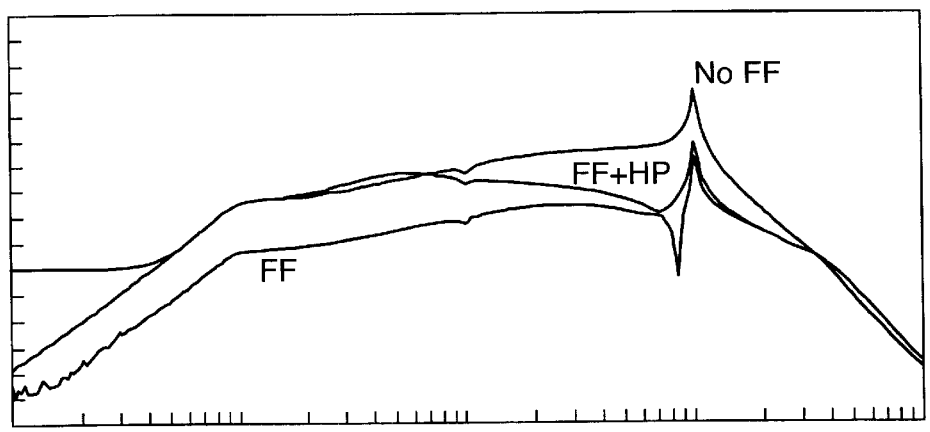
FIGS. 3A and B are Bode plots showing the positional error response (frequency response) of embodiments of the present invention, to perturbations of the main plate and base frame of a lithographic projection apparatus.
Figure 3B:
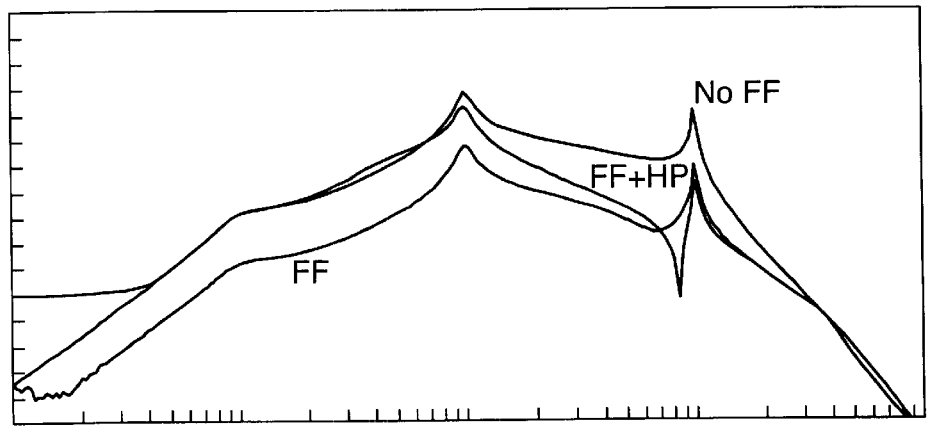

Results of a simulation of the present invention are shown in FIGS. 3A and B. These Figures are Bode plots of, respectively, the amplitude of servo position errors in response to perturbations of the main plate 12 and the base frame 13. Each graph shows the effects of having no feedforward (the line labeled No FF), feedforward alone (FF) and feed forward+high-pass filtering (FF+HP). It will be seen that the response with feedforward only is approximately 20 dB better than with feedforward+high pass filtering over a relatively wide band. However, the high-pass filtered signal does produce significant improvement as compared to no feedforward, and also introduces a substantial notch in the response. The control system can be tuned so that this notch coincides with a given frequency, e.g. the eigenfrequency of the lens 11; in that way, a larger vibration compensation can be achieved.

Embodiment 4

FIG. 4 renders a schematic elevation and partial cross-section of part of a lithographic projection apparatus according to a particular embodiment of the invention. A projection lens PL is affixed to a frame HO, and is positioned above the plane of motion of a wafer stage WT. An Interferometric measurement device IF is also attached to the frame HO. These measurement device IF produces at least one beam 1 of radiation (e.g. light from a HeNe laser), which is directed at a reflective surface on a proximal side of the wafer table WT; there, the beam 1 undergoes reflection and then returns to a detecting unit in the device IF. In principle, there will be one such beam 1 for each degree of freedom (X, Y, Z, Rx, Ry, Rz) in which it is desired to measure the position and motion of the wafer table WT. The principles of interferometry on which the operation and use of the device IF are based are well known in the field of lithography, and will not be discussed here. For more information, see the said patent application WO 97/33205, for example.

Also shown in FIG. 4 is a second radiation beam 2, which is directed from the device IF to a reflector R mounted on the underside of the lens PL, close to the wafer table WT; analogous to beam 1, beam 2 undergoes reflection from the reflector R back to a detecting unit in the device IF. Once again, there will generally be one such beam 2 for each degree of freedom in which it is desired to perform position and motion measurements.

The above-described arrangement allows the relative position of the lens PL and the wafer table WT to be interferometrically determined. In general, the device IF will be embodied to generate a signal S_12 indicative of the momentary relative position of items PL and WT; double differentiation of the signal S_12 then yields the relative acceleration S_12" of items PL and WT. However, such double differentiation will typically introduce a relatively large phase lag, making the resulting signal relatively difficult to apply in a servo loop. An alternative is that the device IF be embodied to generate a signal S_12' indicative of the momentary relative velocity of items PL and WT; such a signal S_12' need then only be differentiated once to produce an acceleration signal S_12", thus alleviating the phase-lag problem.

Seeing as the device IF will generally be present in a lithographic projection apparatus anyway, it is a relatively simple step to use them in the manner described here for enaction of the present invention. However, in many cases, the use of a dedicated accelerometer (such as meter 18 in Embodiment 2) will be preferable, for reasons of servo efficiency, for example.

What is claimed is:

1. A lithography apparatus comprising:
   a radiation system for supplying a projection beam of radiation;
   a first object table provided with a mask holder for holding a mask, and connected to a first positioning mechanism;
   a second object table provided with a substrate holder for holding a substrate, and connected to a second positioning mechanism;
   a projection system for imaging an irradiated portion of the mask onto a target portion of the substrate;
   a detection mechanism constructed and arranged to detect accelerations of the projection system, and generating at least one acceleration signal representative thereof; and
   a control mechanism constructed and arranged to be responsive to the acceleration signal and to generate at least one control signal to control at least one of the first and second positioning mechanisms so as to move the corresponding object table, thereby to compensate for movements of the projection system.

2. An apparatus according to claim 1, wherein said detection mechanism and said control mechanism are adapted to detect and compensate for movements of the projection system having a frequency in the range of 20–400 Hz.

3. An apparatus according to claim 1 or 2, wherein said detection mechanism and said control mechanism are tuned to compensate most exactly for movements of the projection system in a frequency band around its eigenfrequency, particularly within ±20 Hz.

4. A lithography apparatus comprising:
   a radiation system for supplying a projection beam of radiation;
   a first object table provided with a mask holder for holding a mask, and connected to a first positioning mechanism;
   a second object table provided with a substrate holder for holding a substrate, and connected to a second positioning mechanism;
   a projection system for imaging an irradiated portion of the mask onto a target portion of the substrate;
   a detection mechanism constructed and arranged to detect accelerations of the projection system, and generating at least one acceleration signal representative thereof;
   control mechanism constructed and arranged to be responsive to the acceleration signal and to generate at least one control signal to control at least one of the first and second positioning mechanisms so as to move the corresponding object table, thereby to compensate for movements of the projection system; and
   a high-pass filter for filtering the acceleration signal produced by the detection mechanism.

5. An apparatus according to claim 4, wherein said high-pass filter has a cut-off frequency in the range 0.1–50 Hz.

6. An apparatus according to claim 1, wherein said detection mechanism comprises an accelerometer.

7. An apparatus according to claim 1, wherein said detection mechanism employs an interferometer.

8. A lithography apparatus comprising:
   a radiation system for supplying a projection beam of radiation;
   a first object table provided with a mask holder for holding a mask, and connected to a first positioning mechanism;
   a second object table provided with a substrate holder for holding a substrate, and connected to a second positioning mechanism;
   a projection system for imaging an irradiated portion of the mask onto a target portion of the substrate;

a detection mechanism constructed and arranged to detect accelerations of the projection system, and generating at least one acceleration signal representative thereof;

a control mechanism constructed and arranged to be responsive to the acceleration signal and to generate at least one control signal to control at least one of the first and second positioning mechanisms so as to move the corresponding object table, thereby to compensate for movements of the projection system;

a position sensing device constructed and arranged to sense the relative position of the projection system and at least one of the first and second object tables, and to generate a position signal;

a second control mechanism constructed and arranged to be responsive to said position signal and to generate a second control signal; and an adding device constructed and arranged to add together said control signal and said second control signal.

9. A lithography apparatus comprising:

a radiation system for supplying a projection beam of radiation;

a first object table provided with a mask holder for holding a mask, and connected to a first positioning mechanism;

a second object table provided with a substrate holder for holding a substrate, and connected to a second positioning mechanism;

a projection system for imaging an irradiated portion of the mask onto a target portion of the substrate;

a detection mechanism constructed and arranged to detect accelerations of the projection system, and generating at least one acceleration signal representative thereof; and a control mechanism constructed and arranged to be responsive to the acceleration signal and to generate at least one control signal to control at least one of the first and second positioning mechanisms so as to move the corresponding object table, thereby to compensate for movements of the projection system;

wherein the positioning mechanism comprises a long stroke moving mechanism and a short stroke moving mechanism, and the control signal is applied to the short stroke moving mechanism.

10. An apparatus according to claim 1, wherein the detection mechanism is mounted on the projection system in relatively close proximity to the one of the first and second object tables whose position is to be controlled in response to the control signal, particularly within 5 cm thereof.

11. A method of controlling the relative position of a projection system and at least one object table in a lithographic projection apparatus, the method comprising:

measuring accelerations of the projection system;

determining a force to be applied to the object table to cause movement thereof so as to compensate for movements of the projection system; and applying the determined force to that object table.

12. A method according to claim 11, wherein said force is applied to said object table via a short stroke actuator.

13. A device manufacturing method comprising:

providing a substrate which is at least partially covered by a layer of radiation-sensitive material;

providing a mask which contains a pattern;

using a projection beam of radiation to project an image of at least part of the mask pattern onto a target area of the layer of radiation-sensitive material;

performing the method using a lithographic projection apparatus comprising:

a radiation system for supplying the projection beam of radiation;

a first object table provided with a mask holder for holding a mask, and connected to a first positioning mechanism;

a second object table provided with a substrate holder for holding a substrate, and connected to a second positioning mechanism; and a projection system for imaging an irradiated portion of the mask onto a target portion of the substrate, detecting accelerations of the projection system, and generating at least one acceleration signal representative thereof; and generating at least one control signal in response to the acceleration signal to control at least one of the first and second positioning mechanisms so as to move the corresponding object table, thereby to compensate for movements of the projection system.

14. A device manufactured using a method as claimed in claim 13.

* * * * *